US009338898B2

(12) United States Patent
Fujii et al.

(10) Patent No.: US 9,338,898 B2
(45) Date of Patent: May 10, 2016

(54) METHOD OF PRODUCING A PRINTED WIRING BOARD

(71) Applicant: MITSUI MINING & SMELTING CO., LTD., Tokyo (JP)

(72) Inventors: Joji Fujii, Tokyo (JP); Hiroaki Tsuyoshi, Saitama (JP); Hiroto Iida, Saitama (JP); Kazuhiro Yoshikawa, Saitama (JP); Mitsuyoshi Matsuda, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 273 days.

(21) Appl. No.: 13/785,348

(22) Filed: Mar. 5, 2013

(65) Prior Publication Data
US 2013/0247373 A1 Sep. 26, 2013

Related U.S. Application Data

(60) Provisional application No. 61/608,742, filed on Mar. 9, 2012.

(51) Int. Cl.
| | |
|---|---|
| H05K 3/02 | (2006.01) |
| H05K 3/10 | (2006.01) |
| H05K 3/42 | (2006.01) |
| H05K 3/00 | (2006.01) |

(52) U.S. Cl.
CPC ............... *H05K 3/42* (2013.01); *H05K 3/0038* (2013.01); *H05K 3/0035* (2013.01); *H05K 2201/0112* (2013.01); *Y10T 29/49165* (2015.01); *Y10T 428/12438* (2015.01)

(58) Field of Classification Search
CPC .................... Y10T 29/49165; Y10T 29/49155
USPC ..................................................... 29/852, 846
See application file for complete search history.

(56) References Cited

U.S. PATENT DOCUMENTS

6,107,003 A * 8/2000 Kuwako .................. 430/314
6,240,636 B1 * 6/2001 Asai et al. .................. 29/852

(Continued)

FOREIGN PATENT DOCUMENTS

| | | |
|---|---|---|
| JP | 1999-346060 | 12/1999 |
| JP | 2001-226796 | 8/2001 |

(Continued)

OTHER PUBLICATIONS

U.S. Appl. No. 13/813,678 to Hiroto Iida, filed Feb. 1, 2013.
U.S. Appl. No. 13/727,735 to Mitsuyoshi Matsuda et al., filed Dec. 27, 2012.
Search report from P.C.T., mail date is May 14, 2013.

(Continued)

*Primary Examiner* — Paul D Kim
(74) *Attorney, Agent, or Firm* — Greenblum & Bernstein, P.L.C.

(57) ABSTRACT

A method-of producing a printed wiring board comprises: forming a via-hole for interlayer connection in a laminate in which a copper foil for laser processing comprises a copper foil and an easily soluble laser absorption layer provided on a surface of the copper foil which has a higher etching rate to a copper etchant than the copper foil and absorbs an infrared laser beam and another conductor layer is laminated through an insulating layer, directly irradiating the infrared laser beam on the easily soluble laser absorption layer; and removing the easily soluble laser absorption layer from the surface of the copper foil in a desmear step of removing a smear in a via-hole and/or a microetching step as a pretreatment of an electroless plating step is adopted.

8 Claims, 2 Drawing Sheets

(56) References Cited

U.S. PATENT DOCUMENTS

| | | | |
|---|---|---|---|
| 6,698,093 B2* | 3/2004 | Nishii | 29/852 |
| 6,815,709 B2* | 11/2004 | Clothier et al. | 257/40 |
| 6,889,433 B1* | 5/2005 | Enomoto et al. | 29/852 |
| 7,022,276 B2* | 4/2006 | Hirano et al. | 264/156 |
| 7,140,103 B2* | 11/2006 | Gaku et al. | 29/852 |
| 7,205,483 B2* | 4/2007 | Yamashita et al. | 174/254 |
| 7,297,285 B2* | 11/2007 | Chang | 216/13 |
| 7,918,021 B2* | 4/2011 | Kogure et al. | 29/852 |
| 8,075,788 B2* | 12/2011 | Arai et al. | 216/13 |
| 2002/0182432 A1* | 12/2002 | Sakamoto et al. | 428/553 |
| 2003/0148136 A1* | 8/2003 | Yamamoto et al. | 428/607 |
| 2004/0188263 A1* | 9/2004 | Sugimoto et al. | 205/111 |
| 2006/0074165 A1* | 4/2006 | Gelissen et al. | 524/430 |
| 2010/0038115 A1* | 2/2010 | Matsuda et al. | 174/254 |

FOREIGN PATENT DOCUMENTS

| | | |
|---|---|---|
| JP | 2001-288595 | 10/2001 |
| JP | 2001-308477 | 11/2001 |
| JP | 2004-006611 | 1/2004 |
| JP | 2004-006612 | 1/2004 |
| JP | 2004-006613 | 1/2004 |
| JP | 2006-339270 | 12/2006 |
| JP | 2009-111133 | 5/2009 |
| TW | 469228 B | 12/2001 |
| TW | 200422337 | 11/2004 |

OTHER PUBLICATIONS

Taiwanese Office action issued with respect to application No. 102107791, mail date is Sep. 24, 2014.

* cited by examiner

METHOD OF PRODUCING A PRINTED WIRING BOARD

BACKGROUND OF THE INVENTION

1. Field of the Invention

The present invention relates to a method of producing a printed wiring board and a copper foil for laser processing, particularly to a method of producing a printed wiring board which forms a via-hole for interlayer connection by a Cu direct method and a copper foil for laser processing.

2. Background Art

Conventionally, the multilayering of printed wiring boards has been spreading with the enhanced performance and downsizing in electronic devices and electric appliances. A multilayer printed wiring board is prepared by laminating three or more wiring layers through an insulating layer and the wiring layers are electrically connected by an interlayer connection means such as a via-hole and a through hole. A build-up process is known as a method of producing a multilayer printed wiring board. The build-up process is a production method sequentially laminating wiring layers on an inner layer circuit board through an insulating layer followed by interconnection of the wiring layers to finish a multilayered wiring board. For example, when an ultra-fine wiring pattern is formed by the modified semi-additive process (MSAP process) or the like, a build-up printed wiring board is produced by the following procedures. First, a core substrate provided with an inner layer circuit is laminated with copper foil through an insulating layer; a via-hole or the like is formed in the produced copper clad laminate by laser processing or the like; and electroless plating is carried out for interlayer connection. Next, a plating resist is provided on a seed layer (copper foil+electroless plating layer) depending on a wiring pattern; electroplating is carried out; and then the plating resist is removed and then the seed layer under the plating resist is removed by etching. The repeated above steps for a required number of times finishes a build-up multilayer printed wiring board having desired number of wiring layers.

According to finer wiring patterns, the interlayer connection performed by via-holes each having a top diameter of 100 micrometers or less has been increased in recent years. Such micro via-holes are generally drilled by laser processing using a carbon dioxide laser. On this occasion, a Cu direct method in which copper foil is directly irradiated with a carbon dioxide laser has been employed to drill the copper foil and an insulating layer at the same time. However, laser beam absorption of copper is very low in a wavelength range of far-infrared to infrared rays such as a carbon dioxide laser. So, when the micro via-holes are formed by the Cu direct method, pretreatment such as black-oxide treatment which increases absorption of the infrared laser-beam on the surface of a copper foil has been required.

However, when black-oxide treatment or the like is provided on the surface of a copper foil, the copper foil thickness decreases and deviates because the surface of the copper foil is etched. So, when a seed layer is removed, formation of a wiring pattern having high linearity and good line width is made difficult because the etching time should be set depending on the part of the seed layer having the largest thickness.

On the contrary, Japanese Patent Laid-Open No. 2001-226796 discloses a copper foil provided with an alloy layer mainly comprising Sn and Cu on the copper foil surface as a technology which does not require pretreatment before infrared laser processing. According to Japanese Patent Laid-Open No. 2001-226796, the infrared laser absorption of Sn is twice or more higher than that of Cu at the same room temperature and the same surface roughness. So, when an alloy layer mainly comprising Sn and Cu is provided on a copper foil surface, the copper foil surface is directly irradiated with the infrared laser beam without pretreatment such as black-oxide treatment to form a via-hole having a diameter of 100 µm.

Further, Japanese Patent Laid-Open No. 2001-308477 discloses a surface-treated copper foil for laser drilling in which a nickel layer or a cobalt layer having a specific thickness is provided on one side of the copper foil. By providing a nickel layer or a cobalt layer having a specific thickness on the surface of the copper foil, the temperature of the infrared laser-irradiated part is continuously held at a copper melting temperature or more, and it makes drilling of both the copper foil layer and the base material resin layer at the same time possible.

However, the copper foil for infrared laser drilling disclosed in Japanese Patent Laid-Open No. 2001-226796 employs a method in which a metallic Sn layer is provided on the surface of the copper foil by vapor deposition or plating, and then Cu—Sn alloy layer is formed on the surface of the copper foil by the diffusion through heat treatment. For this reason, the alloy layer has a distribution of Sn content along thickness direction, and the etching rate along thickness direction of the copper foil may deviates. Further, the outermost surface of the copper foil has an extremely high content of Sn. So, when a popular etchant for a copper foil is used, it is difficult to dissolve and remove the outermost surface by etching, and since the etching rate is uneven along thickness direction, thickness of the copper foil may deviate. Furthermore, the surface of the alloy layer may have an etching rate smaller than that of an electrolytic copper plated wiring pattern. So, a good wiring pattern is hardly obtained because the wiring pattern is more rapidly etched and a line width decreases when a seed layer is removed.

On the contrary, copper foil may be etched after removing only Sn by using an etchant selectively etches Sn. However, thickness of the copper foil after selectively etching Sn will have a deviation because the content of Sn in the alloy layer deviates as described above. So, formation of a wiring pattern having high linearity and good line width is made difficult because the etching time should be set depending on the part of the seed layer having the largest thickness also.

Further, when a multilayer printed wiring board is produced using the surface-treated copper foil disclosed in Japanese Patent Laid-Open No. 2001-308477, nickel layer or cobalt layer provided on the surface of the copper foil is selectively removed by etching to obtain a seed layer having a uniform thickness without a deviation in thickness in the copper foil. When the seed layer is removed by etching after the electrolytic copper plated wiring pattern is formed, only the copper foil having a uniform thickness may be dissolved, and a good wiring pattern having a fine line width might be obtained. When this surface-treated copper foil is used, pretreatment such as black-oxide treatment to the copper foil surface is not required in the production of a printed wiring board, but a step of selectively removing the nickel layer or cobalt layer by etching is indispensable after infrared laser processing. So, it is impossible to reduce process steps.

So, an object of the present invention is to provide a method of producing a printed wiring board which reduces process steps, is excellent in infrared laser processability and is suitable for formation of an excellent wiring pattern; and to provide a copper foil for laser processing and a copper-clad laminate.

SUMMARY OF THE INVENTION

As a result of intensive and extensive researches, the present inventors have achieved the above object by employing a copper foil for laser processing comprising an easily soluble laser absorption layer on the surface of a copper foil as described below.

A method of producing a printed wiring board according to the present invention comprises: forming a via-hole for interlayer connection in a laminate in which a copper foil for laser processing comprises a copper foil and an easily soluble laser absorption layer provided on a surface of the copper foil which has a higher etching rate to a copper etchant than the copper foil and absorbs an infrared laser beam and another conductor layer is laminated through an insulating layer, directly irradiating the infrared laser beam on the easily soluble laser absorption layer; and removing the easily soluble laser absorption layer from the surface of the copper foil in a desmear step of removing a smear in the via-hole and/or a microetching step as a pretreatment of an electroless plating step.

In the method of producing a printed wiring board according to the present invention, the easily soluble laser absorption layer may be a copper-tin alloy layer containing 8 mass % or more and less than 25 mass % of tin.

In the method of producing a printed wiring board according to the present invention, the easily soluble laser absorption layer may be a high carbon content copper layer containing 0.03 mass % to 0.4 mass % of carbon.

In the method of producing a printed wiring board according to the present invention, it is preferable that thickness of the easily soluble laser absorption layer is 3 µm or less.

In the method of producing a printed wiring board according to the present invention, it is preferable that thickness of the copper foil is 7 µm or less.

In the method of producing a printed wiring board according to the present invention, it is preferable that a roughening treatment is provided on a surface of the copper foil on the side to be laminated to the insulating layer.

In the method of producing a printed wiring board according to the present invention, it is preferable that a primer resin layer is provided on a surface of the copper foil on the side to be laminated to the insulating layer.

In the method of producing a printed wiring board according to the present invention, it is preferable that a carrier foil is provided on the easily soluble laser absorption layer and the carrier foil is released before forming a via-hole.

A copper foil for laser processing according to the present invention comprises a copper foil and an easily soluble laser absorption layer provided on a surface of the copper foil, the easily soluble laser absorption layer which has a higher etching rate to a copper etchant than the copper foil and absorbs a laser beam.

In the copper foil for laser processing according to the present invention, it is preferable that a carrier foil is releasably provided on the easily soluble laser absorption layer.

A copper-clad laminate according to the present invention comprises an insulating layer and a copper foil layer provided on at least one side of the insulating layer, wherein an easily soluble laser absorption layer which has a higher etching rate than the copper foil layer and absorbs a laser beam is provided on a surface of the copper foil layer.

Advantage of Invention

A method of producing a printed wiring board according to the present invention employs a copper foil for laser processing comprising an easily soluble laser absorption layer absorbing an infrared laser beam provided on a surface of the copper foil. So, a via-hole is formed by directly irradiating a carbon dioxide laser on the easily soluble laser absorption layer without pretreatment for increasing the absorption of laser beams such as black-oxide treatment. Moreover, the easily soluble laser absorption layer has a higher etching rate to a copper etchant than the copper foil and is removed from the surface of the copper foil in a desmear step and/or a microetching step as a pretreatment of an electroless plating step carried out to achieve the electrical connection between the copper foil and a conductor layer. So, an additional step of removing the easily soluble laser absorption layer is dispensable. Accordingly, production steps are reduced as compared with conventional technologies, and production cost is reduced. Further, the easily soluble laser absorption layer performs a role as an etching resist of the copper foil by arranging thickness and/or material of the easily soluble laser absorption layer in the desmear step and/or the microetching step. As a result, a deviation in thickness of the copper foil is reduced because the surface of the copper foil is prevented from being etched in various etching processes before wiring pattern formation. Accordingly, a wiring pattern having a good etching factor is formed.

DETAILED DESCRIPTION OF THE PREFERABLE EMBODIMENTS

The embodiments of the present invention will be demonstrated. A method of producing a printed wiring board according to the present invention comprises: forming a via-hole for interlayer connection in a laminate in which a copper foil for laser processing comprises a copper foil and an easily soluble laser absorption layer provided on a surface of the copper foil which has a higher etching rate to a copper etchant than the copper foil and absorbs an infrared laser beam and another conductor layer is laminated through an insulating layer, directly irradiating the infrared laser beam on the easily soluble laser absorption layer; and removing the easily soluble laser absorption layer from the surface of the copper foil in a desmear step of removing a smear in a via-hole and/or a microetching step as a pretreatment of an electroless plating step. The laminate will be demonstrated with reference to drawings, and then the method of producing a printed wiring board will be demonstrated step by step.

1. Laminate

Figure 1:
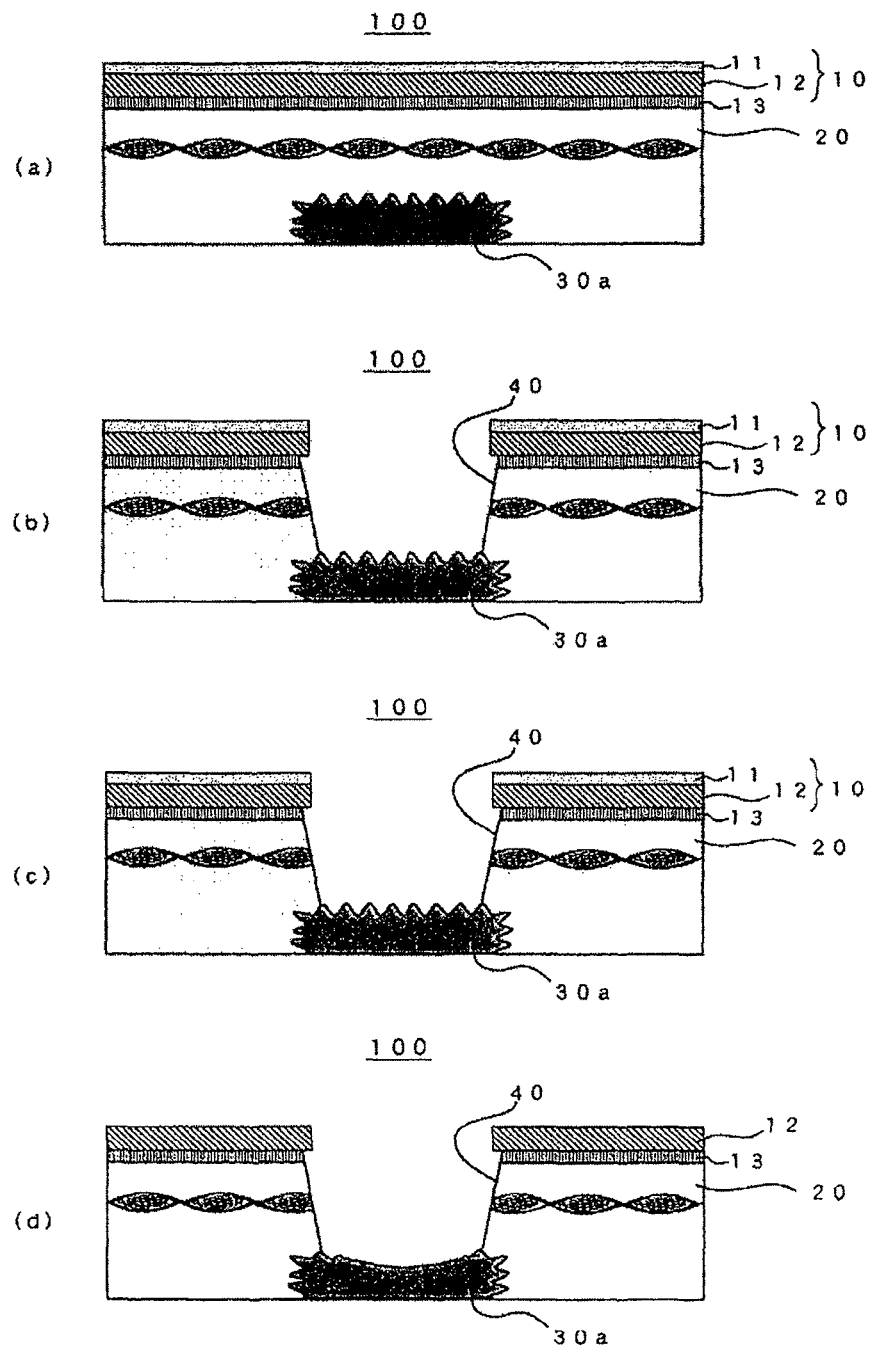
FIG. 1 is a figure for describing an example of a method of producing a printed wiring board according to the present invention.

First, a laminate will be demonstrated. In the present invention, the laminate 100 is a laminate in which copper foil for laser processing 10 and another conductor layer is laminated through an insulating layer 20, wherein the copper foil for laser processing 10 comprises a copper foil 12 and an easily soluble laser absorption layer 11 provided on a surface of the copper foil 12 as shown in FIG. 1(*a*). The laminate 100 according to the present invention may have at least a layer structure in which the copper foil for laser processing 10 (easily soluble absorption layer 11/copper foil 12), the insulating layer 20, and another conductor layer is laminated sequentially from the laser irradiation side as shown in FIG. 1(*a*), i.e. layer for improving bonding properties including a roughening treatment (not shown) and a primer resin layer 13 may be interposed between the copper foil 12 (copper foil layer) in the copper foil for laser processing 10 and the insulating layer 20. In the present invention, the laminate 100 may have at least a layer structure in which the copper foil for laser processing 10 (easily soluble absorption layer 11/copper foil 12), the insulating layer 20, and another conductor layer is laminated, i.e. the laminate 100 may be a double-sided copper-clad laminate or may be a laminate in which the copper foil for laser processing is laminated to an inner layer circuit board provided with the conductor layer through an insulating layer. Note that FIG. 1 exemplifies an inner layer circuit board in which a conductor pattern 30a is formed as another conductor layer. Another conductor layer is not limited to the embodiment shown in FIG. 1 and may include a copper foil layer provided all over the bottom layer of the insulating layer. The form of another conductor layer is not particularly limited.

1-1. Copper Foil for Laser Processing

Next, the copper foil for laser processing 10 will be demonstrated. As described above, the copper foil for laser processing 10 comprises the copper foil 12 and the easily soluble laser absorption layer 11 provided on a surface of the copper foil 12.

(1) Easily Soluble Laser Absorption Layer

In the present invention, the easily soluble laser absorption layer 11 is a layer which has a higher etching rate to a copper etchant than the copper foil and absorbs an infrared laser beam, and any layer may be employed as long as it is a layer having these etching performance and laser beam absorption performance. Examples include a copper-tin alloy layer and a high carbon content copper layer described below. By producing a printed wiring board using the copper foil for laser processing 10 comprising the copper foil 12 and the easily soluble laser absorption layer 11 provided on a surface of the copper foil 12, the laminate 100 is drilled by a Cu direct method in which a laser beam with a wavelength range of infrared to far-infrared rays such as a carbon dioxide laser is irradiated without pretreatment such as black-oxide treatment.

Further, in the method of producing a printed wiring board, the laminate 100 is subjected to various etching process including the desmear step and the microetching step after laser drilling and before wiring pattern formation. The easily soluble laser absorption layer 11 dissolves in these various etching processes carried out before wiring pattern formation. So, additional etching process for removing the easily soluble laser absorption layer 11 is dispensable. For example, when a wiring pattern is formed by the MSAP process, the easily soluble laser absorption layer 11 is removed in various etching processes before wiring pattern formation. The timing of dissolving and removing the easily soluble laser absorption layer 11 can be controlled by thickness, material (such as tin content and carbon content), and the like. So, only the easily soluble laser absorption layer 11 is dissolved and removed without dissolving the surface of the copper foil 12 before carrying out the electroless plating step for interlayer connection. Accordingly, when a wiring pattern is formed by the MSAP process, a seed layer having a uniform thickness is obtained because an electroless-plated film is formed on the copper foil 12 having the original thickness. So, according to the present invention, a wiring pattern having a good etching factor is obtained.

i) Copper Etchant

In the present invention, any copper etchant can be used without particular limitation as long as it is generally used as an etchant for copper. Examples of the copper etchant usable include various copper etchants such as a copper chloride etchant, an iron chloride etchant, a sulfuric acid-hydrogen peroxide etchant, a sodium persulfate etchant, an ammonium persulfate etchant, and a potassium persulfate etchant.

ii) Copper-Tin Alloy Layer

Figure 2:
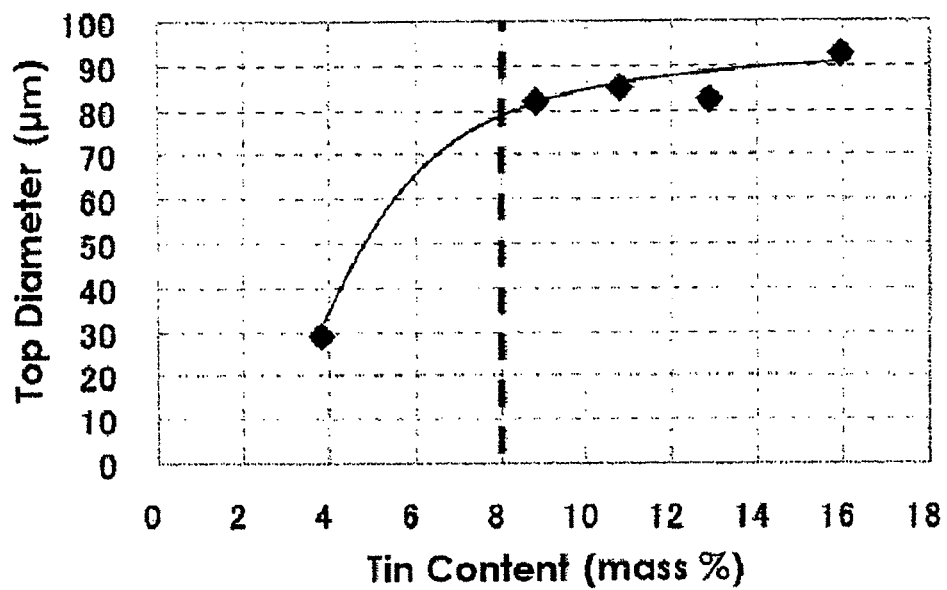
FIG. 2 is a figure showing the relation between the tin content in copper-tin alloy foil and laser processability.

In the present invention, the easily soluble laser absorption layer 11 may be a copper-tin alloy layer containing 8 mass % or more and less than 25 mass % of tin. Here, the tin content in the copper-tin alloy layer of 8 mass % or more is to satisfy the laser absorption performance required for the easily soluble laser absorption layer 11. FIG. 2 shows the laser drillability in an electrodeposited copper-tin alloy foil. Note that FIG. 2 shows the top diameter when an electrodeposited copper-tin alloy foil having different tin content are subjected to laser drilling under the following conditions. The conditions in the laser drilling are as follows. Thickness of each electrodeposited copper-tin alloy foil is 3 μm. Then, each electrodeposited copper-tin alloy foil was drilled using a carbon dioxide laser adjusted a pulse energy of 6.9 mJ, a pulse width of 16 μs and a beam diameter of 120 μm. Note that the top diameter as described herein is the opening diameter of a hole on the incident surface of laser irradiation.

As shown in FIG. 2, when the content of tin in the electrodeposited copper-tin alloy foil is 8 mass % or more, a hole having a top diameter of 80 μm or more is formed using a carbon dioxide laser adjusted to the above conditions. Also when drilling is carried out according to the above conditions on an electro-deposited copper foil having a thickness of 3 μm in which the laser irradiation surface side is subjected to black-oxide treatment, a hole having a top diameter of 80 μm or more is formed. So, the matter proves that the electrodeposited copper-tin alloy foil having a tin content of 8 mass % or more has the laser absorption performance equivalent to or more than that in the black-oxide treatment. That is, when a copper-tin alloy layer having a tin content of 8 mass % or more is provided on a surface of the electro-deposited copper foil, a hole having a top diameter of 80 μm or more is easily formed by laser processing without pretreatment such as black-oxide treatment. On the contrary, when the content of tin in the electrodeposited copper-tin alloy foil is less than 8 mass %, the absorption of laser beams may be higher than that of the electro-deposited copper foil without tin, but the top diameter will be less than 30 μm, i.e. a laser drillability at a required level hardly be achieved. So, as described above, it is preferable that the tin content of the copper-tin alloy layer is 8 mass % or more from the point of view of elimination of pretreatment before laser processing.

Figure 3:
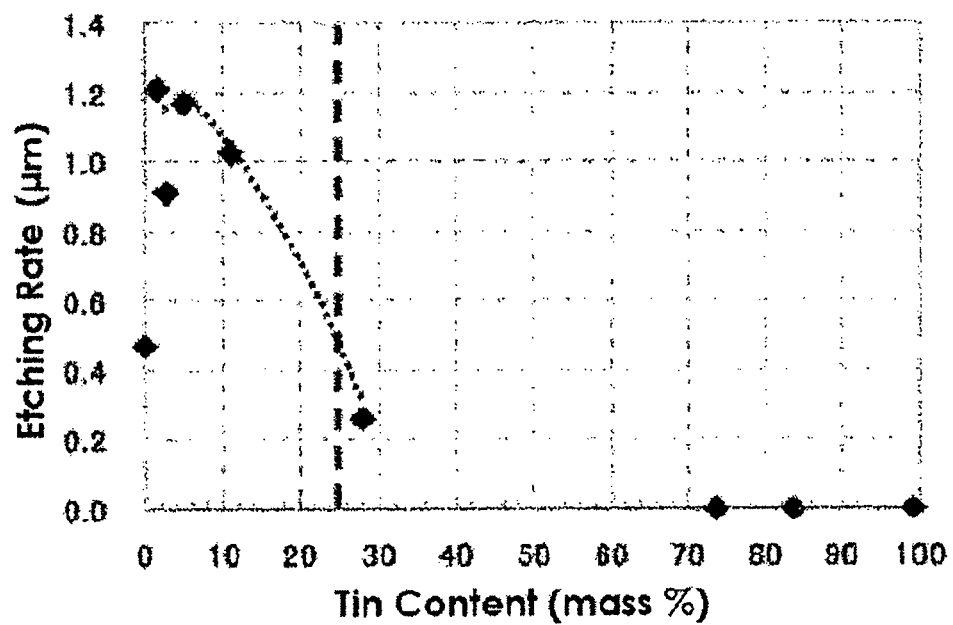
FIG. 3 is a figure showing the relation between the tin content in copper-tin alloy foil and the etching rate to a copper etchant.

On the contrary, the tin content in the copper-tin alloy layer of less than 25 mass % is set to satisfy the etching performance described above. FIG. 3 is a figure showing the relation between the tin content in copper-tin alloy foil and the etching rate to a copper etchant. Note that the etching rate in FIG. 3 is thickness reduced by etching when an electrodeposited copper-tin alloy foil (thickness: 3 μm) having different tin content is immersed in a sulfuric acid-hydrogen peroxide etchant for 30 seconds, rinsed by water, dried, and then thickness is measured by cross-section observation. That is, the etching amount (μm) is thickness reduction when each electrodeposited copper-tin alloy foil is immersed in the etchant for 30 seconds. As shown in FIG. 3, the etching performance as described above is satisfied because the etching rate of the electrodeposited copper alloy foil having tin content of less than 25 mass % is larger than that of conventional electrodeposited copper foil (tin content: 0 mass %). Further, the copper-tin alloy layer is uniformly etched along thickness direction because metal composition along thickness direction is uniform when a copper-tin alloy layer is provided.

On the contrary, when the tin content is 25 mass % or more, etching rate to a copper etchant may be smaller than that of the copper foil without tin. In this case, the layer may perform a role as an etching resist layer in various etching processes before wiring pattern formation as described above, and the etching rate is reduced as compared with that of the copper-tin alloy layer having a tin content of less than 25 mass %. So, it is preferable that the tin content is less than 25 mass % when production efficiency is taken into consideration because longer time is required to dissolve and remove a copper-tin alloy layer by etching in various etching processes according to thickness of the copper-tin alloy layer before wiring pattern formation.

Further, it is preferable that the copper-tin alloy layer is an electrodeposited copper-tin alloy layer obtained by the electrolysis of a copper-tin alloy electrolytic solution containing copper ions and tin ions from the point of view that an alloy layer having a uniform metal composition is easily formed along thickness direction. The electrodeposited copper-tin alloy layer can reduce an etching rate deviation along thickness direction, and the copper-tin alloy layer is dissolved in a uniform thickness.

iii) High Carbon Content Copper Layer

In the present invention, the easily soluble laser absorption layer 11 may be a high carbon content copper layer containing 0.03 mass % to 0.4 mass % of carbon. The high carbon content copper having carbon content in the above range satisfies the laser beam absorption performance and the etching performance described above. Specifically, as the high carbon content copper having carbon content in the above range has about ⅓ to ½ thermal conductivity of that of pure copper, when the surface of the high carbon content copper foil is irradiated with the laser beam in an infrared ray wavelength region, the heat hardly diffuses as compared with the copper foil having a low carbon content. Accordingly, the part irradiated with the laser beam at the copper can maintain the temperature at melting point or higher easily. So, drilling by a Cu direct method is carried out without applying pretreatment such as black-oxide treatment by using a copper foil comprising the high carbon content copper layer. On the contrary, the carbon content of less than 0.03 mass % is not preferable because the laser drillability is made poor and formation of a hole having an objective top diameter with good reproducibility is made difficult. Further, it is preferable that the carbon content is 0.4 mass % or less from the point of view of productivity because the production of a high carbon content copper layer having a carbon content exceeding 0.4 mass % is technically difficult.

For example, the high carbon content copper layer is formed by electrolyzing the sulfuric acid-based copper electrolytic solution containing 100 ppm to 1000 ppm of one or mixture of glue, gelatin, and collagen peptide.

The easily soluble laser absorption layer 11 may be any of a copper-tin alloy layer and a high carbon content copper layer as described above. However, a copper-tin alloy layer is preferable from the point of view that the easily soluble laser absorption layer 11 is dissolved and removed in a uniform thickness along thickness direction in various etching processes before wiring pattern formation, and in particular, it is more preferable to be an electrodeposited copper-tin alloy layer. A high carbon content copper layer is less preferable because etched surface may be rough after finishing the above various etching processes because carbon is dispersed in the layer.

iv) Thickness of Easily Soluble Laser Absorption Layer

Thickness of the easily soluble laser absorption layer 11 may be an appropriate value because it is dissolved and removed by etching at a suitable stage before wiring pattern formation. For example, when etching processes for the purpose of surface cleaning such as a desmear step and a micro-etching step are carried out a plurality of times before wiring pattern formation, preferable thickness is 3 μm or less and more preferable thickness is 2 μm or less. Too thick easily soluble laser absorption layer 11 is not preferable because dissolution and removal of the easily soluble laser absorption layer 11 in various etching processes carried out before wiring pattern formation is made difficult. On the contrary, thickness of the easily soluble laser absorption layer 11 of less than 0.1 μm is not preferable because improvement in absorption of laser beams is made difficult, and same time, the easily soluble laser absorption layer 11 may not sufficiently perform a role as an etching resist of the electro-deposited copper foil in various etching processes before wiring pattern formation. So, from these points of view, it is preferable that thickness of the easily soluble laser absorption layer 11 is 0.3 μm or more and more preferable thickness is 0.5 μm or more.

However, the timing to dissolve and remove the easily soluble laser absorption layer 11 can be suitably adjusted by changing not only thickness of the easily soluble laser absorption layer 11 but also the tin content in the copper-tin alloy layer or the carbon content in the high carbon content copper layer as described above. Difference in thickness of the easily soluble laser absorption layer 11 and the tin content or the carbon content can make dissolution and removal of the easily soluble laser absorption layer 11 by etching at a desired stage in the production process of the printed wiring board possible.

(2) Copper Foil

Next, the copper foil 12 will be demonstrated. In the present invention, the copper foil 12 is that composed of so-called pure copper having a copper content of 99% or more. The copper foil 12 may be any of an electro-deposited copper foil and a rolled copper foil. However, when economical efficiency and production efficiency are taken into consideration, an electro-deposited copper foil is more preferable.

The copper foil 12 is a layer which constitutes a part of the seed layer and bonded to the insulating layer 20 when a printed wiring board is produced. Thickness of the copper foil 12 may be a thickness equivalent to that of the copper foil commercially available as a popular material for a printed wiring board. However, for example, when a wiring pattern is formed by a process including etching processes such as the MSAP process and the subtractive process, the thinner copper foil 12 is the better and preferable thickness is 7 μm or less from the point of view to achieve better etching factor. Particularly, when a wiring pattern is formed by the MSAP process using the copper foil for laser processing 10, it is preferable that thickness of the copper foil 12 is 3 μm or less and more preferable thickness is 2 μm or less from the point of view to form a finer wiring pattern with a good etching factor. Note that, when thickness of the copper foil 12 is 7 μm or less, a copper foil for laser processing is preferable to be provided with a carrier foil (not shown) which will be demonstrated later not to cause defects such as wrinkles and rupture in handling.

Further, from the point of view to improve the etching factor, the surface of the copper foil 12 on the side bonded to the insulating layer 20, i.e. the surface opposite on the surface provided with the easily soluble laser absorption layer 11 (hereinafter; bonding surface) is preferable to be smooth. Specifically, it is preferable that the surface roughness (Rzjis) of the bonding surface is 3 μm or less and more preferable surface roughness (Rzjis) is 2 μm or less. Note that, even when a roughening treatment described later is provided on the bonding surface of the copper foil 12, the surface roughness of the bonding surface is the surface roughness of the bonding surface provided with roughening treatment.

(3) Roughening Treatment

In the present invention, the roughening treatment (not shown) may be provided on the bonding surface of the copper foil 12, i.e. the surface opposite on the surface provided with the easily soluble laser absorption layer 11. By providing the roughening treatment on the bonding surface of the copper foil 12, the bonding between the copper foil 12 and the insulating layer 20 is enhanced. Methods for forming the roughening treatment include methods of attaching fine metal particles on the surface (bonding surface) of the copper foil 12 and forming a roughened surface by an etching method. The method for forming the roughening treatment may be carried out by any method as long as it can physically improve the bonding between the copper foil 12 and the insulating layer 20, and various popular methods on roughening treatment can be employed.

(4) Primer Resin Layer

In the present invention, the bonding surface of the copper foil 12 may be provided with a primer resin layer 13. In this case, the primer resin layer 13 may be provided on the roughening treatment, or the primer resin layer 13 may be directly provided on the bonding surface of the copper foil 12 without roughening treatment as shown in FIG. 1(*a*). In the present invention, the primer resin layer 13 is an adhesive layer having good adhesion to both the copper foil 12 and the insulating layer 20, and for example, it may be a layer composed of a resin composition containing an epoxy resin and an aromatic polyamide resin. By providing the primer resin layer 13 on the bonding surface of the copper foil 12, the copper foil 12 well bonds to the insulating layer 20.

Thickness of the primer resin layer 13 is not particularly limited as long as the primer resin layer 13 improves bonding between the copper foil 12 and the insulating layer 20, but thickness may be in the range of from 0.5 µm to 10 µm, for example.

(5) Other Treatment Layers

In the present invention, the bonding surface of the copper foil for laser processing 10 may be optionally subjected to various surface treatment such as rust-proofing treatment and silane coupling agent treatment in addition to the roughening treatment described above, and as a matter of course, these treatment layers may lie between the copper foil 12 and the insulating layer 20 in the laminate 100.

1-2. Copper Foil for Laser Processing with Carrier Foil

As described above, in the copper foil for laser processing having a copper foil thickness of 7 µm or less, it is preferable to be used in the form of a copper foil for laser processing with a carrier foil in which the carrier foil is provided on the easily soluble laser absorption layer 11 to improve the handling ability in the production of the laminate 100.

(1) Carrier Foil

The carrier foil is a support foil releasably provided on the surface of the copper foil for laser processing 10 on the side of the easily soluble laser absorption layer 11; and the carrier foil prevent defects generation in the copper foil including wrinkles and rupture and improve the handling ability by supporting the copper foil for laser processing. A material constituting the carrier foil is not particularly limited, but a conductive metallic material is preferable because the easily soluble laser absorption layer and the copper foil (electro-deposited copper foil) can be formed on the carrier foil through a release layer by an electrolytic process. Examples of the carrier foil which can be used include copper foil including copper alloy foil, aluminum foil, a composite foil in which a metal-plated layer such as a copper-plated layer or a zinc-plated layer is provided on the surface of aluminum foil, stainless steel foil, and a resin film whose surface is coated with metal. Among these materials, a copper foil is suitably used as the carrier foil. The copper foil as the carrier foil is preferable from the point of view of resource preservation because after the carrier foil is released from the copper foil for laser processing 10, the copper foil is reused as a copper raw material.

Thickness of the carrier foil is not particularly limited, but thickness may be about 5 µm to about 100 µm, for example. The carrier foil thickness of less than 5 µm is not preferable because too thin thickness hardly achieve role as a carrier foil, improving of the handling ability of an ultra-thin copper foil for laser processing having a thickness of 7 µm or less. Furthermore, from the point of view of reuse ability and the like, thickness of the carrier foil is preferable to be 100 µm or less, and a thickness of 35 µm or less is sufficient.

(2) Release Layer

In the present invention, the release layer is a layer for releasably bonding the carrier foil to the copper foil for laser processing 10. The release layer is required both easy release ability by hand work and bonding of the carrier foil and the copper foil for laser processing 10 with proper bond strength until the carrier foil is released. Examples of such a release layer include an inorganic release layer constituted from an inorganic material and an organic release layer constituted from an organic material.

i) Inorganic Release Layer

Examples of the inorganic material constituting the inorganic release layer include one or mixture selected from the group consisting of chromium, nickel, molybdenum, tantalum, vanadium, tungsten, cobalt, and oxides thereof.

ii) Organic Release Layer

Examples of the organic material constituting the organic release layer include one or mixture selected from the group consisting of a nitrogen-containing organic compound, a sulfur-containing organic compound and a carboxylic acid. The release layer may be any of the inorganic release layer and the organic release layer, but it is preferable to be the organic release layer from the point of view that releasing performance of the carrier foil is stable.

More specifically, it is preferable to use following compounds as nitrogen-containing organic compounds, sulfur-containing organic compounds, and carboxylic acids. Examples of the nitrogen-containing compounds include orthotriazoles, aminotriazoles, imidazoles, and salts or derivatives thereof. In particular, examples include carboxybenzotriazole which is an orthotriazole, 3-amino-1H-1,2,4-triazole which is an aminotriazole, and N',N'-bis(benzotriazolylmethyl)urea which is a triazole derivative. Any one or more of these are used to form the organic release layer constituted from nitrogen-containing compounds.

Examples of the sulfur-containing compound include thiazole, mercaptobenzothiazole, dibenzothiazyl disulfide, cyclohexylamine salt of mercaptobenzothiazole, dicyclohexylamine salt of mercaptobenzothiazole, thiocyanuric acid and 2-benzimidazole thiol. When the organic release layer is formed by using the sulfur-containing compound, it is particularly preferable to use mercaptobenzothiazole and thiocyanuric acid.

Examples of the carboxylic acids include a high-molecular weight carboxylic acid. It is particularly preferable to use a fatty acid among the high-molecular weight carboxylic acid which is a monocarboxylic acid having a long chain hydrocarbon. The fatty acid may be a saturated fatty acid, but it is preferable to use an unsaturated fatty acid such as oleic acid and linoleic acid.

iii) Thickness of Release Layer

Thickness of the release layer is preferable to be 100 nm or less and more preferable thickness is 50 nm or less. In a so-called peelable-type electrodeposited copper foil with a carrier foil, a release layer is generally provided on the surface of the carrier foil, and copper is deposited on the carrier foil through the release layer by a technology such as electrolysis to form the electro-deposited copper foil. Thickness of the organic release layer exceeding 100 nm will make formation of the electro-deposited copper foil on the release layer difficult. At the same time, the bond strength between the carrier foil and the electro-deposited copper foil will decrease. So, it is preferable that thickness of the release layer is 100 nm or less. The lower limit of thickness of the release layer is not particularly limited as long as a release layer has a uniform thickness. However, if thickness is less than 1 nm, a release layer having a uniform thickness will be hardly formed, i.e. thickness has deviation. Accordingly, it is preferable that thickness of the release layer is 1 nm or more and more preferable thickness is 2 nm or more.

(3) Heat Resistant Metal Layer

In the copper foil for laser processing with a carrier foil, it is also preferable to provide a heat resistant metal layer between the carrier foil and the release layer or between the release layer and the easily soluble laser absorption layer of the copper foil for laser processing to finish a layer structure of carrier foil/heat resistant metal layer/release layer/copper foil for laser processing; or a layer structure of carrier foil/release layer/heat resistant metal layer/copper foil for laser processing.

1-3. Insulating Layer

Next, the insulating layer 20 will be demonstrated. The insulating layer 20 is not particularly limited as long as it is a layer composed of a material which has been used as an insulating layer of a printed wiring board, and a suitable one is appropriately selected depending on various electric properties and the like required for the printed wiring board.

1-4. Another Conductor Layer

Another conductor layer is not particularly limited as long as it is a layer which performs a role as a conductor layer in the printed wiring board; and it may be a conductor pattern 30a of the inner layer circuit board of a multilayer printed wiring board or may be a copper foil layer on the other side of a double-sided copper-clad laminate, i.e. is not particularly limited.

2. Method of producing Printed Wiring Board

Next, a method of producing a printed wiring board according to the present invention will be demonstrated with reference to a case where a multilayer printed wiring board is produced by a build-up process (MSAP method), as an example. First, the laminate 100 is prepared as shown in FIG. 1(a). For example, the laminate 100 shown in FIG. 1(a) is produced by laying the copper foil 12 side of the copper foil for laser processing 10 on the inner layer circuit 30a through a so-called B-stage insulating layer constituting material (20), followed by hot pressing. Note that, when the copper foil for laser processing with a carrier foil is used for producing the laminate 100, the carrier foil is released before via-hole formation.

Then, the surface of the easily soluble laser absorption layer 11 which is the outermost layer of the laminate 100 is directly irradiated with a laser beam of a carbon dioxide laser to form a micro via-hole 40 in which the conductor pattern 30a of the inner layer circuit board constitutes the bottom of the via-hole as shown in FIG. 1(b).

After the micro via-hole 40 formation, a desmear step to remove a smear remaining on the bottom of the micro via-hole 40 is carried out by using a desmear solution (See FIG. 1(c)). In the desmear step, the laminate 100 is immersed in a swelling liquid and then immersed in a desmear solution (for example, an aqueous alkaline permanganic acid solution) to remove the smear. The resulting laminate is then subjected to a neutralization process in which the laminate is immersed in a neutralization liquid (reducing agent) to reduce and remove the potassium permanganate.

Next, a microetching step as a pretreatment of electroless plating step is carried out. In the microetching step, a microetchant (examples include a sulfuric acid-hydrogen peroxide etchant and an aqueous ammonium persulfate solution) is used to remove splash adhered to the circumference of the micro via-hole 40. Further, the smear remaining on the bottom of the micro via-hole 40 is also removed (See FIG. 1(d)).

In these desmear step and microetching step, the easily soluble laser absorption layer 11 is removed because the surface of the laminate 100 is brought into contact with a treatment solution such as neutralization liquids and micro etchants having an etching ability of copper. As the etching rate to a copper etchant differs depending on thickness and material (such as tin content and carbon content) of the easily soluble laser absorption layer 11, the timing of dissolving the easily soluble laser absorption layer 11 can be controlled by adjusting thickness and material. For example, when the surface of the copper foil 12 should be cleaned in the microetching step, it is preferable to completely dissolve and remove the easily soluble laser absorption layer 11 in the desmear step by adjusting thickness, material, and the like of the easily soluble laser absorption layer 11. On the contrary, when thickness of the copper foil 12 should be maintained at the original thickness, the easily soluble laser absorption layer 11 is made to remain, not completely dissolved in the desmear step and will be completely dissolved and removed in the following microetching step. The timing of dissolving and removing of the easily soluble laser absorption layer 11 may be appropriately a suitable timing depending on the performance and the like which are required for the printed wiring board.

Then, in the electroless plating step, an electroless-plated layer is formed on both the inner wall of the micro via-hole 40 and the copper foil layer 12 to achieve interlayer connection (not shown). Then, a plating resist is provided on the seed layer (copper foil 12+electroless-plated later); and then a wiring pattern is formed and the inside of the via-hole is filling-plated by electroplating. Then, a multilayer printed wiring board is produced by removing the seed layer under the plating resist by a flash etching process after removing the plating resist. Note that the steps after the electroless plating step are not shown in FIG. 1.

INDUSTRIAL APPLICABILITY

When the copper foil for laser processing according to the present invention is used as described above, formation of a via-hole by directly irradiating a carbon dioxide laser on the easily soluble laser absorption layer is made possible without applying pretreatment for increasing the absorption of laser beams such as black-oxide treatment. It is because a copper foil for laser processing comprising a copper foil and an easily soluble laser absorption layer absorbing an infrared laser beam provided on a surface of the copper foil is used in a method of producing a printed wiring board according to the present invention. Moreover, additional step for removing the easily soluble laser absorption layer is dispensable because the easily soluble laser absorption layer has a higher etching rate to a copper etchant than the copper foil and is removed from the surface of the copper foil in a desmear step of removing a smear in the via-hole and/or a microetching step as a pretreatment of an electroless plating step carried out to achieve the interlayer connection between the copper foil and a conductor layer. Accordingly, production steps are reduced as compared with conventional technologies, and production cost is reduced. Further, the easily soluble laser absorption layer performs role as an etching resist of the copper foil in the desmear step and/or the microetching step when thickness and material of the easily soluble laser absorption layer is controlled. As a result, etching of the surface of the copper foil in various etching processes before wiring pattern formation which causes a deviation in thickness of the copper foil is prevented. Accordingly, a wiring pattern having a good etching factor is formed.

The invention claimed is:

1. A method of producing a printed wiring board comprising:
    providing a laminate comprising
        a copper foil layer comprising a copper foil and an easily soluble laser absorption layer provided directly on a major surface of the copper foil, the easily soluble laser absorption layer exhibiting a higher etching rate to a copper etchant than the copper foil and absorbing an infrared laser beam and
        a conductor layer laminated to the copper foil layer through an insulating layer,
    directly irradiating an infrared laser beam on the easily soluble laser absorption layer to form a via-hole for interlayer connection; and
    removing the easily soluble laser absorption layer from the surface of the copper foil by
        desmearing for removing a smear in the via-hole and microetching as a pretreatment of an electroless plating step.

2. The method of producing a printed wiring board according to claim 1, wherein the easily soluble laser absorption layer is a copper-tin alloy layer containing 8 mass % or more and less than 25 mass % of tin.

3. The method of producing a printed wiring board according to claim 1, wherein the easily soluble laser absorption layer is a high carbon content copper layer containing 0.03 mass % to 0.4 mass % of carbon.

4. The method of producing a printed wiring board according to claim 1, wherein thickness of the easily soluble laser absorption layer is 3 μm or less.

5. The method of producing a printed wiring board according to claim 1, wherein thickness of the copper foil is 7 μm or less.

6. The method of producing a printed wiring board according to claim 1, further comprising providing a roughening treatment on a surface of the copper foil on a side to be laminated to the insulating layer.

7. The method of producing a printed wiring board according to claim 1, further comprising providing a primer resin layer on the surface of the copper foil on the side to be laminated to the insulating layer.

8. The method of producing a printed wiring board according to claim 1, further comprising providing a carrier foil on the easily soluble laser absorption layer and the carrier foil is released before forming the via-hole.

* * * * *